United States Patent
McBride et al.

[11] Patent Number: 6,151,627
[45] Date of Patent: Nov. 21, 2000

[54] MONITORING OF A COMMUNICATION LINK UTILIZING HISTORY-BASED COMPRESSION ALGORITHMS

[75] Inventors: Richard McBride, Aberdour; Stuart J. Boutell, Edinburgh, both of United Kingdom

[73] Assignee: 3COM Technologies, Georgetown, Cayman Islands

[21] Appl. No.: 09/186,656

[22] Filed: Nov. 6, 1998

[30] Foreign Application Priority Data

Mar. 25, 1998 [GB] United Kingdom ............... 9806240

[51] Int. Cl.⁷ .................... G06F 15/173; G06F 15/16
[52] U.S. Cl. ................. 709/224; 709/247; 709/248
[58] Field of Search .................... 709/224, 247, 709/248, 232, 236; 370/392, 394, 473; 380/48

[56] References Cited

U.S. PATENT DOCUMENTS

| | | | |
|---|---|---|---|
| 4,654,480 | 3/1987 | Weiss | 380/48 |
| 5,307,413 | 4/1994 | Denzer | 370/473 X |
| 5,357,614 | 10/1994 | Pattisam et al. | |
| 5,555,377 | 9/1996 | Christensen et al. | 709/247 |
| 5,557,749 | 9/1996 | Norris | 709/228 |
| 5,579,316 | 11/1996 | Venters et al. | 370/392 |
| 5,848,058 | 12/1998 | Ooyoshi et al. | 370/394 X |

FOREIGN PATENT DOCUMENTS

| | | |
|---|---|---|
| 0 089831 A2 | 3/1983 | European Pat. Off. . |
| 0 0408315 A2 | 7/1990 | European Pat. Off. . |

*Primary Examiner*—Zarni Maung
*Assistant Examiner*—Patrice Winder
*Attorney, Agent, or Firm*—Nixon & Vanderhye P.C.

[57] ABSTRACT

The invention concerns in-line monitoring of a communication link between two stations in a frame-based communication network wherein the said two stations employ a compression algorithm for the transmission of frames and a corresponding decompression algorithm for the reception and decompression of the frames, the said algorithms requiring the maintenance at a transmitting station of a compression history in terms of the number of frames transmitted since a datum point and the maintenance of a corresponding compression history at a receiving station in terms of the number of frames received, the frames each including an identification of the compression sequence so that the receiving station can detect mismatch between the compression sequence and the receiving sequence. The monitoring method comprises detecting frames transmitted from one of the stations to the other, detecting whether frames are compressed, decompressing compressed frames and maintaining a compression history corresponding to that maintained by the receiving station.

7 Claims, 3 Drawing Sheets

MONITORING OF A COMMUNICATION LINK UTILIZING HISTORY-BASED COMPRESSION ALGORITHMS

FIELD OF THE INVENTION

The present invention relates to the monitoring of the transmission of data between stations in a frame-based communication network such as a 'wide-area network'.

BACKGROUND OF THE INVENTION

The present invention concerns a novel technique for monitoring the link between a pair of stations in a frame-based network by means of decompression of frames transmitted in a compressed state between the stations. It is customary to transmit frames which are compressed according to a compression algorithm which requires the maintenance of a compression history by the two stations at the ends of the link. The monitoring device or probe maintains, according to the invention, a compression history which, for a given direction of transmission of frames, corresponds to the compression history maintained by the receiver of those frames.

SUMMARY OF THE INVENTION

In order to provide a proper alignment of the compression history maintained in the monitoring device with the compression history maintained at the receiver of the compressed frames, a feature of the invention comprises resetting the compression history in the monitoring device in response to a signal from the transmitter of the frames by way of acknowledgement of the resetting of the decompression history in the receiver.

Normally the monitoring device or probe will monitor the transmission of frames in two directions and accordingly for transmission of frames from a first station to a second station will maintain a compression history corresponding to that pertaining to frames received and decompressed by the second station and for frames transmitted from the second station to the first station will maintain a compression history corresponding to the compression history for frames received by and decompressed by the first station.

A further feature of the invention is the forcing of a reset of compression histories in the first and second stations by interrupting the communication link. Such interruption is intended to cause a receiving station to fail to receive a frame and thereby cause a reset of its compression history.

DETAILED DESCRIPTION

Figure 1:
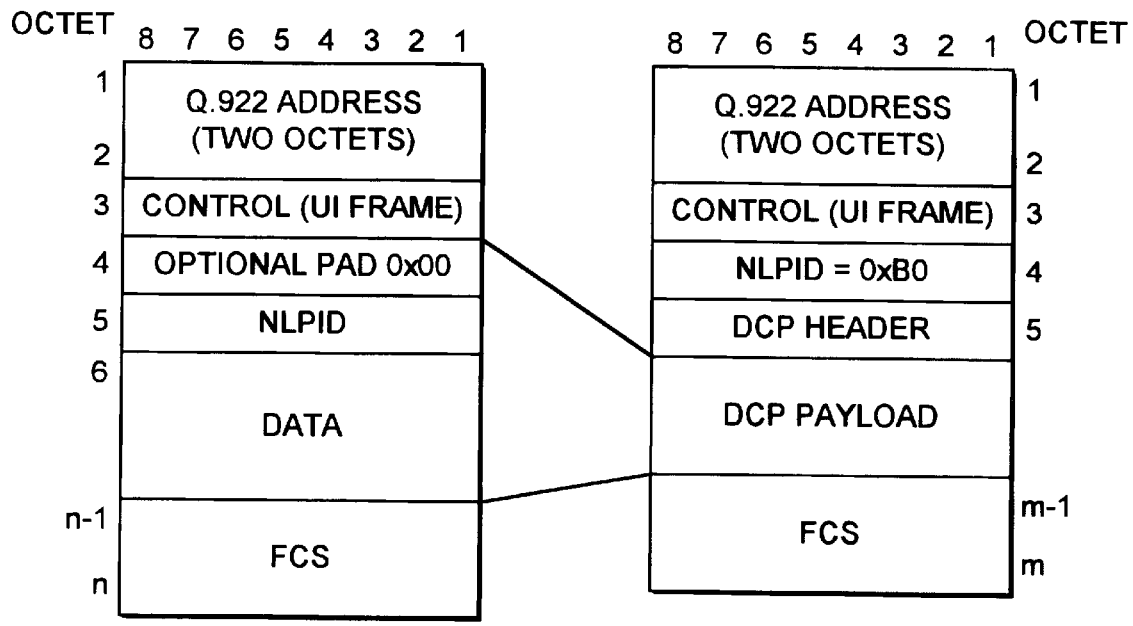
FIG. 1 is an example of data compression of a data frame according to one agreed protocol.

FIG. 1 illustrates by way of example only the compression of a frame according to the 'Data Compression of Frame Relay Implementation Agreement' FRF 9, available from the Frame Relay Forum, Foster City, Calif., United States of America. This example is given only for the sake of explanation; the present invention is intended to be applicable to other forms of frame data compression that may be agreed in future.

In the left-hand part of FIG. 1 is shown the frame format for a frame intended for transmission over a frame relay network using a particular signalling specification for frame mode known as Q.933. The frame consists of n octets, of which the bits are numbered from one to eight in the right to left direction. The frame comprises a two octet address, a control or unique identifier frame octet, an optional pad octet, a fifth octet constituting a network layer protocol identifier (NLPID) followed by a multiplicity of octets constituting the data which is to be transmitted by the frame, and two final octets (FCS) identifying a number in a frame compression sequence.

The right-hand side of FIG. 1 illustrates the frame after compression. The two address octets are followed by the third octet which is the same as that in the original form of the frame, a network layer protocol identifier as specified in ISO/IEC/TR 9577:1992, a header octet for the data compression protocol and a 'payload' constituted by a compressed form of the data in the fourth to $(n-2)^{th}$ octets in the Q.933 annex E frame shown to the left of FIG. 1.

As noted hitherto, it is preferable and customary to employ one of a plurality of known compression algorithms which in operation span a multiplicity of frames, so that the particular operations performed on the data within one frame is in general dependent on either the data in or the operation on a previous frame or multiplicity of frames. Though the particular form of compression algorithm employed is not directly relevant to the present invention, it may be remarked that compression algorithms of this nature, conveniently termed 'history-based algorithms', can be made very much more efficient than a compression algorithm which in its operation on the data within a frame is independent of the data within or operations performed on an earlier frame.

However, the use of efficient data compression algorithms of this nature require a transmitter of compressed frames and a receiver of compressed frames to maintain a compression history, conveniently specified as a numerical sequence which is maintained at both the transmitter and receiver of a set of frames and is conveyed directly or indirectly by digital coding within each frame. Thus under normal circumstances, a transmitter maintains a numerical sequence wherein p is the number of a frame from the start of a compression sequence and the receiver maintains a history constituted by a number r where r is the number of frames received since the start of the compression sequence. Proper transmission, namely compression, conveyance and decompression of a frame requires at any time that p should equal r so that the receiver can employ the decompression algorithm correctly. If p does not equal r, then the receiver is out of numerical alignment with the transmitter and the compression history must be reset.

Under normal circumstances a given pair of stations is sending data bidirectionally so that each of the two stations will maintain a compression history for frames sent to the other station and a decompression history for frames received from the other station.

Figure 2:
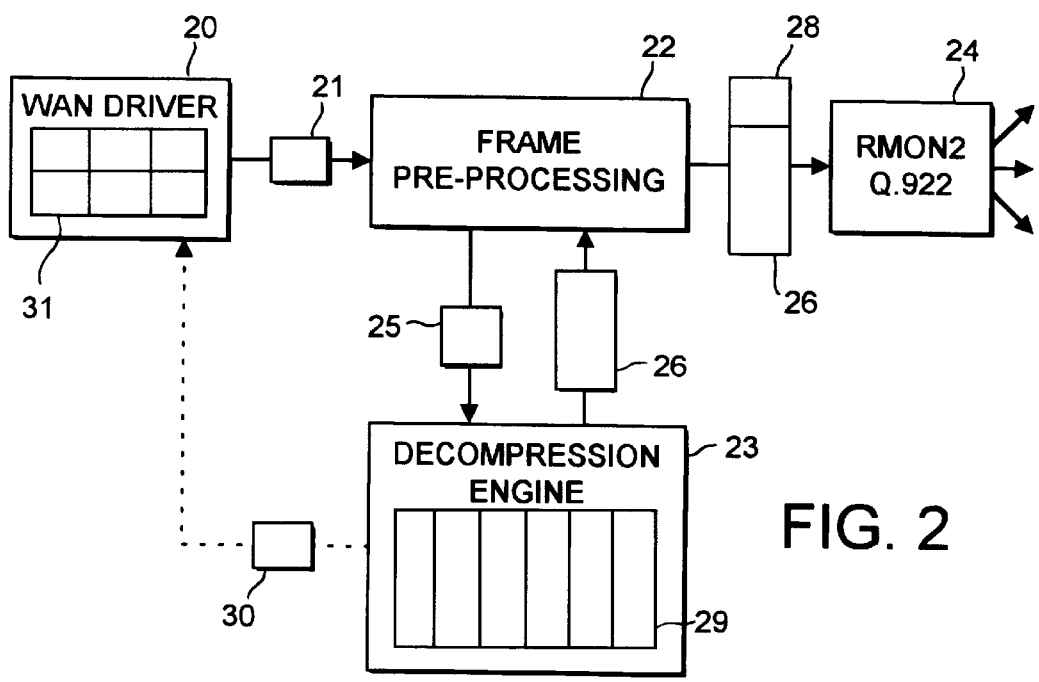
FIG. 2 is a schematic diagram of part of a receiving station which employs decompression of frames.

FIG. 2 illustrates by way of example a typical receiver for a frame-based transmission network. Frames are received by a driver 20 which by way of a buffer 21 passes a frame to a frame preprocessor 22 which attempts to decompress the payload (the compressed data) if it can. The preprocessor passes on either the original, compressed payload or the decompressed payload to the rest of the system.

The frame preprocessor needs to decode a portion of a received frame to be able to determine whether the frame is compressed or not. Generally speaking, the frame processor will extract various flags, ignore any 'padding' octets and extract a control field. The extracted fields will be stored in a buffer, along with the original frame length, and will be examined for known compression algorithms. If a match is detected, a decompression engine 23 will be employed and the returned buffer will be used for the rest of the decode, the original buffer being preferably returned to the 'driver pool', namely made available for the storage of data received by the driver. The frame preprocessor will mark the frame as 'decompressed' in a suitable header.

If the decompression engine should fail to decompress the compressed frame, it may update a separate compression MIB with this information and will pass the original frame on to an RMON2 decoder 24, the construction of which is not relevant to the present invention.

FIG. 2 illustrates the passage of a compressed frame 25 to the decompression engine and the return of decompressed data 26 to the frame pre-processor. A decompressed frame 29 is shown with a header 28 and the decompressed data 26. The decompression engine is shown as containing a pool of memories 29 and as returning a buffer 30 to a memory pool 31 within the driver 20. In practice the memories or buffers are external to the devices they serve and are connected to them by means of data buses. Access to the memories is controlled by an appropriate system of control signals, as known in the art.

Figure 3:
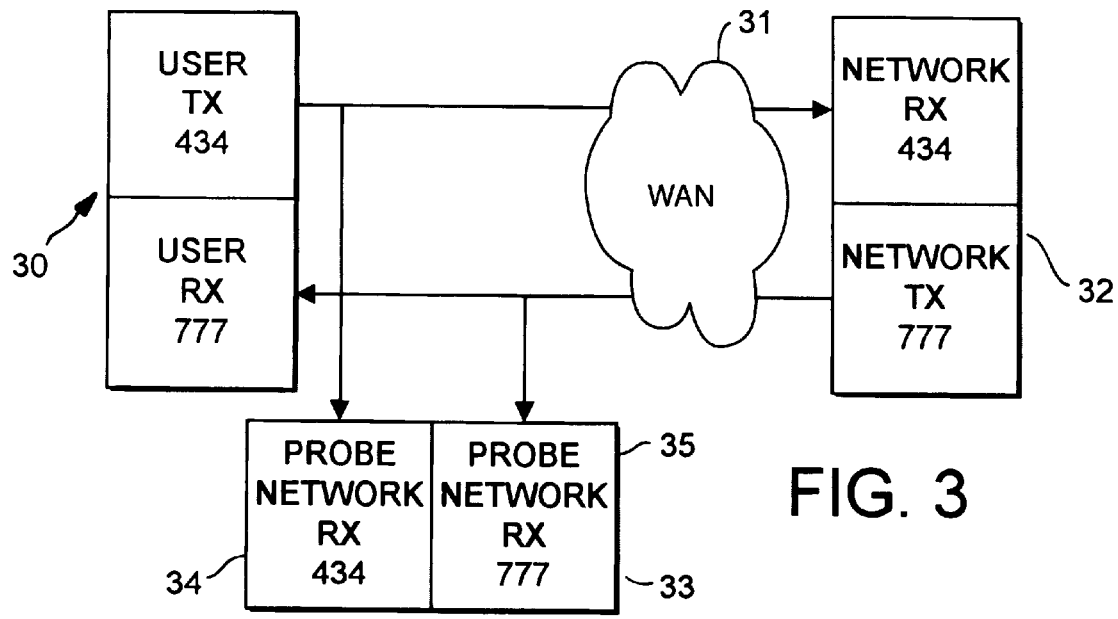
FIG. 3 illustrates in simplified form a wide area network with monitoring of the transmission of data.

FIG. 3 is a diagram illustrating the use of a probe according to the invention in a normal state wherein it is operating in numerical synchronism or alignment with the compression histories of the stations of the link which the probe is monitoring.

A 'user' station 30 is shown notionally divided into a transmitter (TX) section and a receiver (RX) section. The station 30 is connected by way of the wide area network 31 with another station 32, elsewhere in the network. The transmission of frames to and from the user is monitored by means of a monitor 33 which may be connected to a section of monitor cable in the link. The monitor comprises a left-hand section 34 which monitors the transmission of frames from the transmitter section of the user to the network station 32 and a right-hand section 35 which monitors the transmission of frames to the user receiver from the network station 32.

As far as the frames transmitted from the user are concerned the monitor reads, by means of a decoder as shown in, for example, FIG. 2 the frames that are or should be received by the network station receiver. Likewise, the monitor monitors those frames which are or should be received by the user's receiver section.

In each of the sections shown in the parts of FIG. 3 there is a number which represents a sequence number in a compression history. For example, the user transmitter section TX shows the number 434, indicating that the compression history has accumulated four hundred and thirty-four frames since the compression sequence started.

Frames containing compressed data are transmitted from the user transmitter section to the network receiver section and there, likewise, a compression history is maintained. The compression history is represented by a sequence number. Further, each frame transmitted from the user contains a frame compression sequence number (FCS) so th at the FCS of a frame corresponds to the compression history number in the respective transmitter.

For the sake of completeness, it may be seen that the network station's transmission section TX shows its sequence number, in this case shown as 777, and the user receiver section maintains the same number in its compression history, to indicate that it has received the same number of frames.

Further, on the assumption that all the frames transmitted by the two stations have been duly received by the other station and by the sections of the probe, the section of the monitor monitoring frames received by the network station will have a compression history sequence number the same as that in the network station's receiver section and the section of the monitor monitoring frames transmitted to the user station will maintain a history (777) matching that in the user receiver section.

Again, on the assumption that all frames transmitted were correctly received, the technique according to the invention would require only a decompressive decoder of the kind shown in FIG. 2, means for extracting and maintaining a compression sequence and means for recognising a compression algorithm. Such a monitor may be constructed on the same lines as a receiver section for each of the directions of transmission that the monitor is required to supervise.

Nevertheless, the compression and decompression process works in the manner just described over an absolutely reliable link because if one side of the link updates the history based on the sending of a frame but the other side does not see or receive that frame, the histories become misaligned and the decompression algorithm in the receiver will fail. This possibility explains the reason why each compressed frame has a frame compression sequence number. If when the frame is received the FCS contained therein does not correspond to the expected sequence number, the compression histories must be reset and the compression and decompression algorithms need to be restarted from some appropriate datum.

Figure 4:
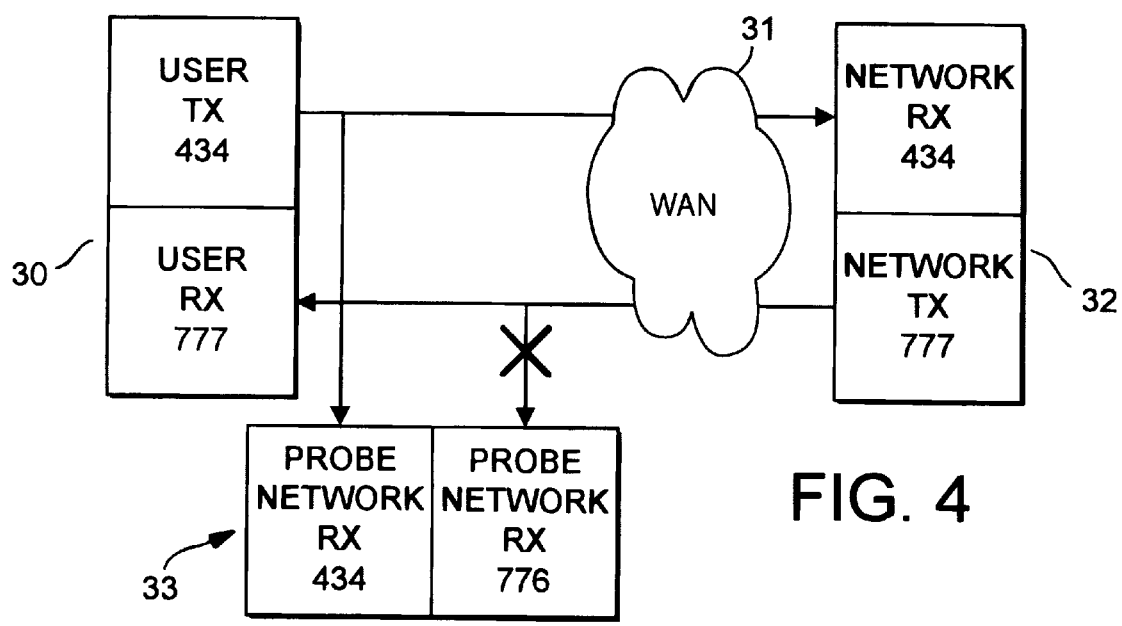
FIGS. 4 to 7 illustrate various states of the network and the monitoring system.

The same consideration applies to the monitoring of the transmissions. As shown in FIG. 4, the monitor has failed to read a frame sent from station 32 to station 30 and its compression sequence is only 776 instead of 777. The compression history in the monitor is mismatched to that in the receiver section 30 and the monitor is not unable to perform proper decoding of the frames sent to station 30.

Figure 5:
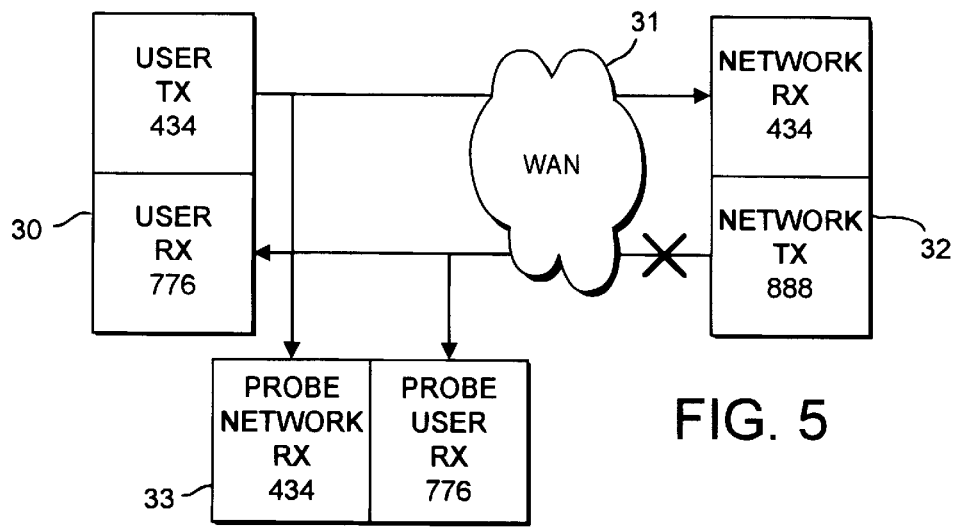
Figure 6:
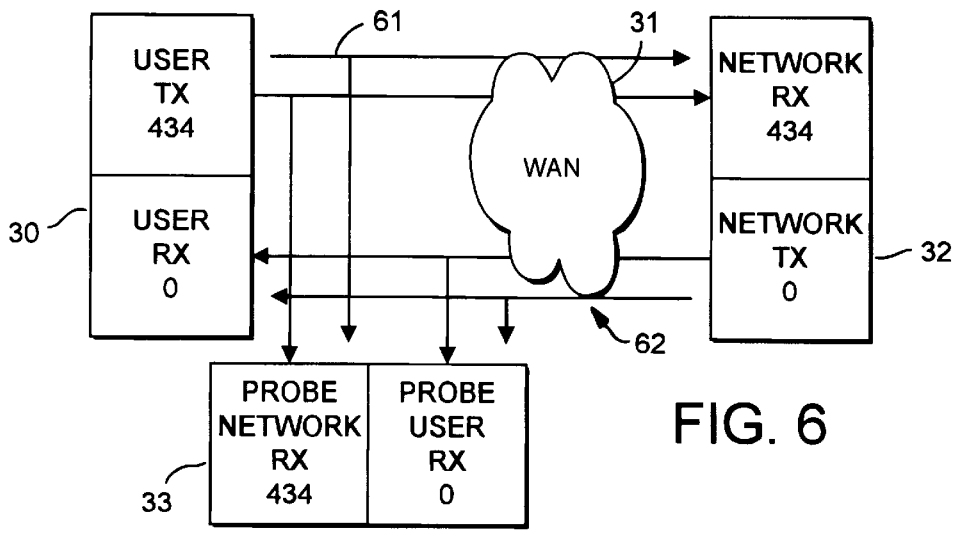

FIG. 5 illustrates an example wherein the user receiver's compression history is mismatched with the network station's transmission compression history. This is shown by the user RX sequence number at 776 whereas the network TX sequence number is 888. The network transmitter has generated frames and updated its compression history to 888 but owing, perhaps, to a fault illustrated by the large X, the user history has not been updated. On the assumption that a next following frame from the network transmitter is received by the user receiver, this frame will have an FCS of 889. The user receiver detects the mismatch between the FCS of the frame and the expected FCS according to the user receiver's compression history, i.e. 777.

The detection of this mismatch will cause the user side to send a 'compression reset' signal (shown by arrows 61), which may take any suitable form as required by the relevant network protocol. At this point, the user's receive history is invalid and all incoming compressed frames must be discarded until the user receiver receives an acknowledgement signal, conveniently termed 'compression reset acknowledgement' from the network transmitter as shown by arrows 62. At this point, the user's compression sequence is reset to zero (or some suitable predetermined other datum) and the network transmitter also resets its compression sequence to the same datum. The compression reset acknowledgement signal is used to reset to zero the compression sequence in that section of the monitor that is monitoring receiver section of station 30.

Figure 7:
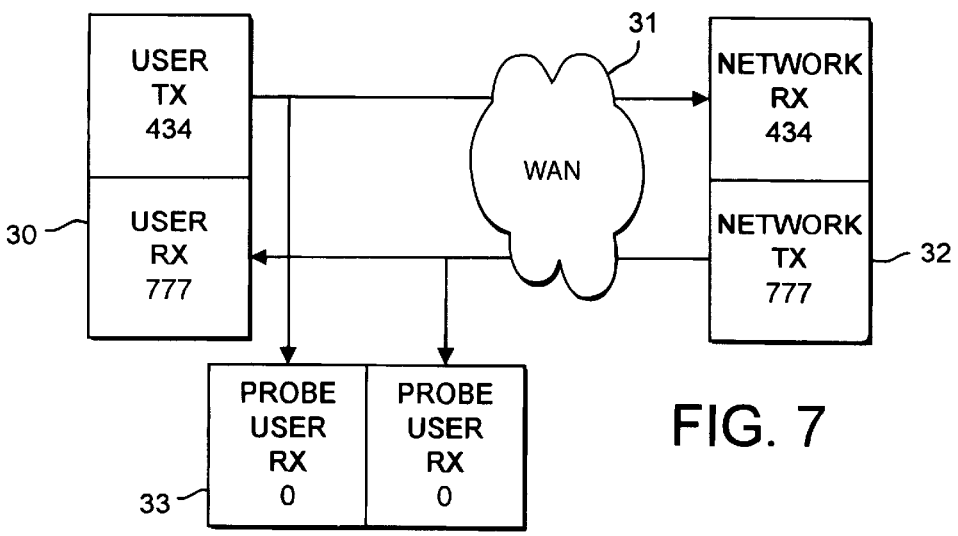

FIG. 7 illustrates a situation in which the monitor is restarted from a rest state. The compression histories start at zero and are out of correspondence with the receiver compression histories to which the compression histories of the probe should correspond. The monitor cannot provide any decompression until a compression reset occurs or is caused to occur.

In the foregoing, the relationship of the monitor to the communication link is passive; it merely reads data from the link.

However, although resetting of compression histories may occur quite frequently in a communication channel that is uncertain, where the communication channel is comparatively noise free, there may be a very long time, possibly hours or even days, before there is the occurrence of some error or loss which will produce mismatch of compression histories in the stations that are communicating with each other and will produce a reset which the monitoring device can employ to reset its own compression history or histories.

In-line monitoring cable includes some circuitry which permits interruption of the data between the monitored stations. This may be exploited in the present invention to provoke resetting of compression histories.

Thus, for example, when the monitor recognises that it is monitoring compressed frames and does not have a corresponding compression history which matches the compression sequence of the incoming frames, the monitor may trigger the in-line circuitry to interrupt the communication between the stations.

This interruption will cause a receiving station to miss compressed frames and thereby cause the monitored stations to initiate a compression history reset which may be observed by the in-line monitor.

At this point, as indicated above, all the compression histories will be reset to a starting state and thereby put into correspondence, allowing the monitor to monitor the compressed frames by maintaining compression histories which are aligned to the compression histories of the monitored stations.

We claim:

1. A method of monitoring a communication link between two stations in a frame-based communication network wherein the said two stations employ a compression algorithm for the transmission of frames and a corresponding decompression algorithm for the reception and decompression of the frames, the said algorithms requiring the maintenance at a transmitting station of a compression history in terms of the number of frames transmitted since a datum point and the maintenance of a corresponding compression history at a receiving station in terms of the number of frames received, the frames each including an identification of the compression sequence so that the receiving station can detect mismatch between the compression sequence and the receiving sequence, the monitoring method comprising detecting frames transmitted by way of the link, detecting whether frames are compressed, decompressing compressed frames and maintaining in a monitor a compression history corresponding to that maintained by the receiving station.

2. A method according to claim 1, wherein a receiving station provides a first signal on detection of a mismatch between a frame compression sequence number within a frame and the compression history maintained by the receiving station, and wherein in response to said first signal the transmitting station provides an acknowledgement signal and said method further comprises responding to said acknowledgement signal to reset said compression history in the monitor.

3. A method according to claim 2, wherein the monitor interrupts or interferes in the communication link between the stations so as to cause a receiving station to miss at least one frame whereby to provoke the production of said first signal and the said acknowledgement signal.

4. A method of monitoring according to claim 3, wherein the monitor monitors the transmission of frames in two directions between stations which transmit frames to each other, and the monitor maintains compression histories in respect of frames sent by each of the two stations.

5. A monitor for monitoring a communication link between two stations in a frame-based communication network wherein the said two stations employ a compression algorithm for the transmission of frames and a corresponding decompression algorithm for the reception and decompression of the frames, the said algorithms requiring the maintenance at a transmitting station of a compression history in terms of the number of frames transmitted since a datum point and the maintenance of a corresponding compression history at a receiving station in terms of the number of frames received, the frames each including an identification of the compression sequence so that the receiving station can detect mismatch between the compression sequence and the receiving sequence and to provide a first signal in response to that mismatch and wherein a transmitting station provides in response to said first signal an acknowledgement signal connoting reset of the compression histories, the monitor comprising means for detecting frames transmitted from the transmitting station to the receiving station, means for detecting whether frames are compressed, means for decompressing compressed frames and means for maintaining a compression history corresponding to that maintained by the receiving station, the last-named means being arranged to respond to said acknowledgement signal to reset said compression history in the monitor.

6. A monitor according to claim 5, and adapted to interrupt or to interfere in the communication link between the stations so as to cause the receiving station to miss at least one frame whereby to provoke the production of said first signal and the said acknowledgement signal.

7. A monitor according to claim 6, wherein the monitor monitors the transmission of frames in two directions between the two stations and the monitor maintains compression histories in respect of frames sent by each of the two stations.

* * * * *